(12) United States Patent
Wang et al.

(10) Patent No.: US 6,677,515 B2
(45) Date of Patent: Jan. 13, 2004

(54) HIGH PERFORMANCE THERMOELECTRIC MATERIAL AND METHOD OF FABRICATION

(75) Inventors: Jun Wang, Gilbert, AZ (US); Daniel S. Marshall, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 29 days.

(21) Appl. No.: 09/928,581

(22) Filed: Aug. 13, 2001

(65) Prior Publication Data

US 2003/0029492 A1 Feb. 13, 2003

(51) Int. Cl.[7] ............... H01L 35/34; H01L 35/22; H01L 35/14
(52) U.S. Cl. ............ 136/201; 136/238; 136/239
(58) Field of Search ............... 136/200, 201, 136/236.1, 238, 239

(56) References Cited

U.S. PATENT DOCUMENTS

| 3,256,702 A | 6/1966 | Henderson ............... 62/3 |
| 5,658,834 A | 8/1997 | Dowben ............... 438/478 |
| 6,025,611 A | 2/2000 | Dowben ............... 257/183 |
| 6,444,894 B1 * | 9/2002 | Sterzel ............... 136/205 |

FOREIGN PATENT DOCUMENTS

| EP | 1102334 A2 | 5/2001 |
| GB | 1015985 | 1/1966 |
| JP | 02219285 | 8/1990 |
| JP | 04099075 | 3/1992 |
| JP | 2001148518 | 5/2001 |
| JP | 2001-148518 | * 5/2001 |

OTHER PUBLICATIONS

Mukaida, M., Tsunoda, T., Ueda, M., Imai, Y., "Influence of Structures and Compositions on thermoelectric Properties of Silicon Borides", 20th International Conference on Thermoelectrics, Jun. 2001, pp. 225–228.*
CRC Handbook of Thermoelectric, Chapter 31, "Boron Carbides", pp. 372–386, R.M. Rowe (ed.) 1995, CRC Press, Inc.*

* cited by examiner

*Primary Examiner*—Patrick Ryan
*Assistant Examiner*—Thomas H. Parsons
(74) *Attorney, Agent, or Firm*—William E. Koch

(57) ABSTRACT

A thermoelectric material is disclosed that is manufactured from a method including the steps of: providing a Group IV element boride, and doping the Group IV element boride with a doping element chosen from one of the column III, IV, V elements, wherein the doping element is different from the Group IV element in the Group IV element boride, and the doping element is not boron. An alternate method of fabricating a thermoelectric material includes the steps of simultaneously growing on a substrate a Group IV element boride and at least one doping element chosen from one of the Group III, IV, or V elements wherein the doping element is different than the Group IV element in the Group IV element boride and the doping element is not boron.

17 Claims, 3 Drawing Sheets

*10*

−PRIOR ART−

*20*

−PRIOR ART−

–PRIOR ART–

HIGH PERFORMANCE THERMOELECTRIC MATERIAL AND METHOD OF FABRICATION

FIELD OF THE INVENTION

The present invention pertains to thermoelectric materials, and more particularly to a high performance thermoelectric material and method of fabrication.

BACKGROUND OF THE INVENTION

Thermoelectric power is generated by the Seebeck effect in the thermoelectric material that is used in typical thermoelectric devices. Most commonly, thermoelectric devices are constructed of an N-type and a P-type semiconductor material, such as bismuth telluride. The N-type and P-type semiconductor material are electrically connected in series and thermally connected in parallel. When heat is passed through the material, electricity is generated between the N-type and P-type semiconductor material. Of concern in the choice of materials is the electrical conductivity and thermal conductivity of the thermoelectric material. A good thermoelectric material should have high electrical conductivity and low thermal conductivity. In this regard, additional low thermal k materials exhibiting improved electrical conductivity properties have been found for use as thermoelectric materials, of which included is boron carbide.

Traditionally, the Seebeck effect is defined as the ability to convert a temperature gradient from thermal energy into electrical voltage. By tapping into this voltage, electrical energy can be provided by a thermoelectric device, or module. Of concern in the generation of thermoelectric power is the ratio of the electrical voltage over the temperature gradient in relationship with electrical conductivity and thermal conductivity of a thermoelectric material. A good thermoelectric material should provide higher voltage with a given temperature gradient that is supported by a given heat flux through the material.

Semiconductor materials that are typically utilized as thermoelectric materials have a narrow energy forbidden gap, and provide for the free movement of electrons and holes in the conduction and valance band of the material. As a result, the temperature gradient resulting from a given heat flux through the material does not provide for optimal performance due to a high thermal conductivity of the free electrons and holes. Hopping electron conductive materials have been utilized in which it has been found that hopping electron conductivity reduces the heat carried by the electrons where the reduced electrical conductivity per carrier is offset by increasing the number of hopping carriers and hopping sites, thus providing for the desired low thermal conductivity. Reducing the thermal conductivity of the electrons is accomplished by reducing the mobility of the carrier by forming narrower bands within the energy forbidden gap or by introducing localized traps for the electrons. This hopping electron characteristic found in these materials provides for an improved figure of merit $Z=S^2 O'_e/k$, where S represents the Seebeck coefficient, $O'_e$ represents the electron conductivity, k represents the thermal conductivity, including both the lattice and electronic components of the thermal conductivity. Hopping electrical conductivity has additionally been found to enhance the charge redistribution effect, thus enhancing the Seebeck voltage of hopping electron materials over simple semiconductors. It is understood that hopping electrical or conductive materials can be both n-and p-type.

The current method of fabricating a hopping electron conductor, or thermoelectric material, is to deposit a two-dimensional or three-dimensional quantum well boron carbide structure on to a silicon substrate using state-of-the-art processing capabilities, such as MBE. During fabrication, the materials are heated to a high degree, thereby enhancing crystallinity. The end result is a thermoelectric material having good electrical conductivity, but with remaining unwanted thermal conductivity of the substrate. This process however is impractical in practice due to the use of MBE processing in the fabrication of this thermoelectric material, which is difficult to use in the manufacture of large modules.

With respect to thermoelectric materials, boron carbide has been shown to exhibit modest thermoelectric performance, however fully carbonated perfect boron carbide has a forbidden energy gap of about 3 eV and hence serves as an insulator instead of a good conductor. The modest thermoelectric performance of boron carbide is therefore related to the defects in the material. In addition, boron rich boron carbide has a high Seebeck coefficient. There are however, a limited number of these defects that can be induced in simple boron carbide under manufacturing processing conditions. By varying these manufacturing process conditions, thermoelectric performance is achieved.

Accordingly, to overcome these problems, it is a purpose of the present invention to provide for a means for increasing the Seebeck voltage of a fully carbonated boron carbide material.

It is yet a still further purpose of the present invention to provide for a thermoelectric material having increased stability.

It is yet a still further purpose of the present invention to provide for a boron carbide based material with enhanced thermoelectric performance.

It is still a further purpose of the present invention to provide for a thermoelectric material having a more energetically favorable carbon chain and method of fabricating the thermoelectric material. The advantages are easy process control, better material stability, and increased thermoelectric properties.

It is a still further purpose of the present invention to provide a high performance thermoelectric material that does not require deposition of quantum wells.

SUMMARY OF THE INVENTION

The above problems and others are substantially solved and the above purposes and others are realized in a thermoelectric material comprising a Group IV element boride, such as carbon boride, or silicon boride, which is doped with a doping element chosen from the group consisting of Group III, IV or V elements, wherein the doping element is different from the Group IV element in the Group IV element boride, and the doping element is not boron. In addition, disclosed is a method of fabricating a thermoelectric material including the steps of providing Group IV element boride, such as carbon boride, or silicon boride, and doping the Group IV element boride with a doping element chosen from the group consisting of Group III, IV or V elements, wherein the doping element is different from the Group IV element in the Group IV element boride, and the doping element is not boron. An alternate method of fabricating a thermoelectric material is also disclosed including the steps of simultaneously growing to a desired concentration level on a substrate a Group IV element boride and at least one doping element chosen from the Group III, IV or V elements, wherein the doping element is different from the Group IV element in the Group IV element boride, and the doping element is not boron.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
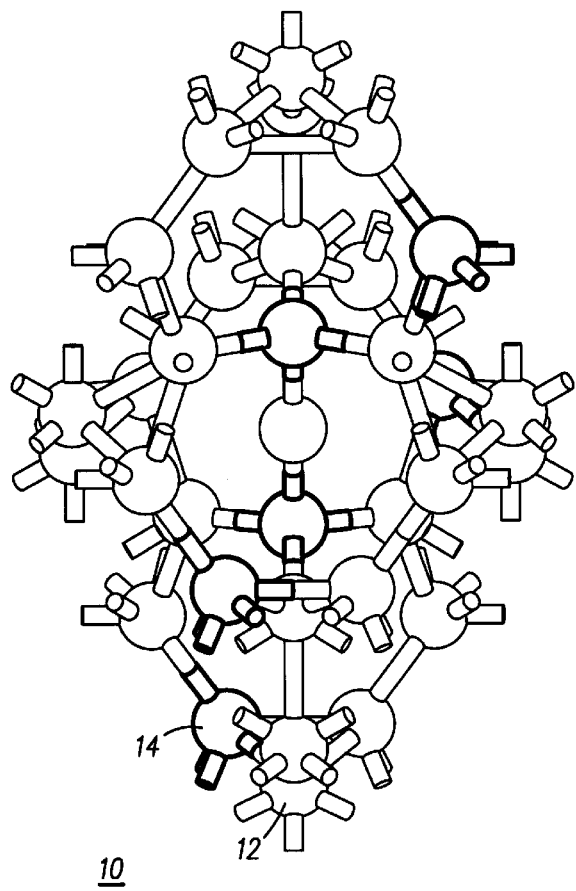
FIG. 1 is a three-dimensional view of a first prior art single unit cell which comprises a thermoelectric material.
Figure 2:
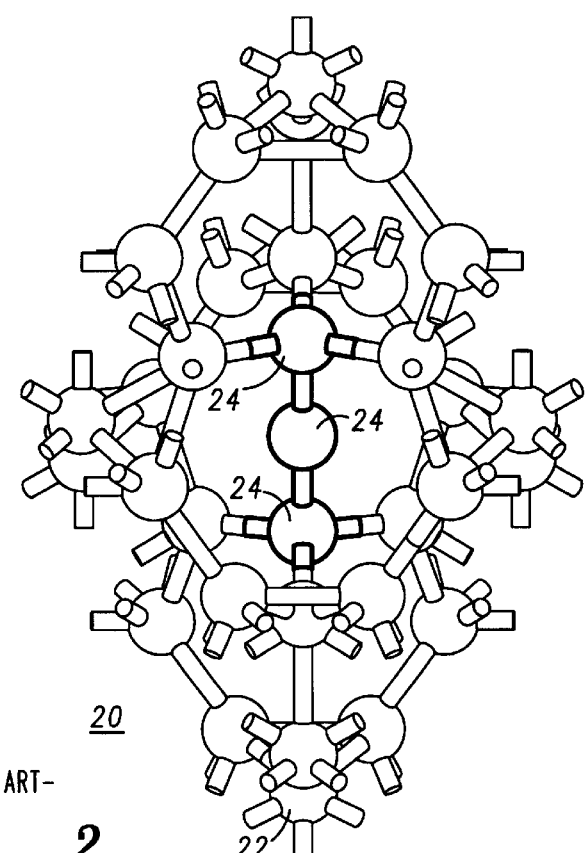
FIG. 2 is a three-dimensional view of another prior art single unit cell which comprises a thermoelectric material.

During the course of this description, like numbers are used to identify like elements according to the different figures that illustrate the invention. Referring now to FIGS. 1 and 2, illustrated in simplified three-dimensional views are single unit cells of a thermoelectric material, generally referenced 10 and 20, respectively. Unit cells 10 and 20 are components of a thermoelectric material comprised of a plurality of unit cells, formed according to known practices, and thus deemed prior art. More particularly, referring to FIG. 1, illustrated is a unit cell 10, comprised of a pure crystalline boron carbide material. Unit cell 10 includes a plurality of boron atoms 12, and a plurality of carbon atoms 14. Unit cell 10 has a forbidden energy gap of approximately 3.0 eV. Accordingly, unit cell 10 is deemed an insulating material. The measurable electrical conductivity of boron carbide made with the boron to carbon ratio of unit cell 10 is related to the intrinsic defects in real boron carbide material.

Referring now to FIG. 2, unit cell 20 is formed using thermal energy to form thermally generated defects in the boron carbide. Generally similar to FIG. 1, unit cell 20 is formed of a plurality of boron atoms 22 and a plurality of carbon atoms 24. As previously stated, the measurable electrical conductivity is related to the intrinsic defects in the material. One type of defect in boron carbide unit cell 20 consists of the three carbon atoms 24 in a chain as illustrated. Unit cell 20 has a formation energy of approximately 1.4 eV per defect. This type of defect forms at high temperatures, however, its energy level in the energy band diagram of boron carbide is approximately 2.0 eV above the valence band-edge and therefore it will not contribute to the p-type electrical conductivity of the boron carbide thermoelectric material. It is understood that this and other defects in the boron carbide unit cell do not generally occur in every unit cell identically. Defects occur randomly within a material composed largely of undefected cell. In boron rich boron carbide, the composition and location of boron and carbon in each unit cell can be very non-uniform.

Figure 3:
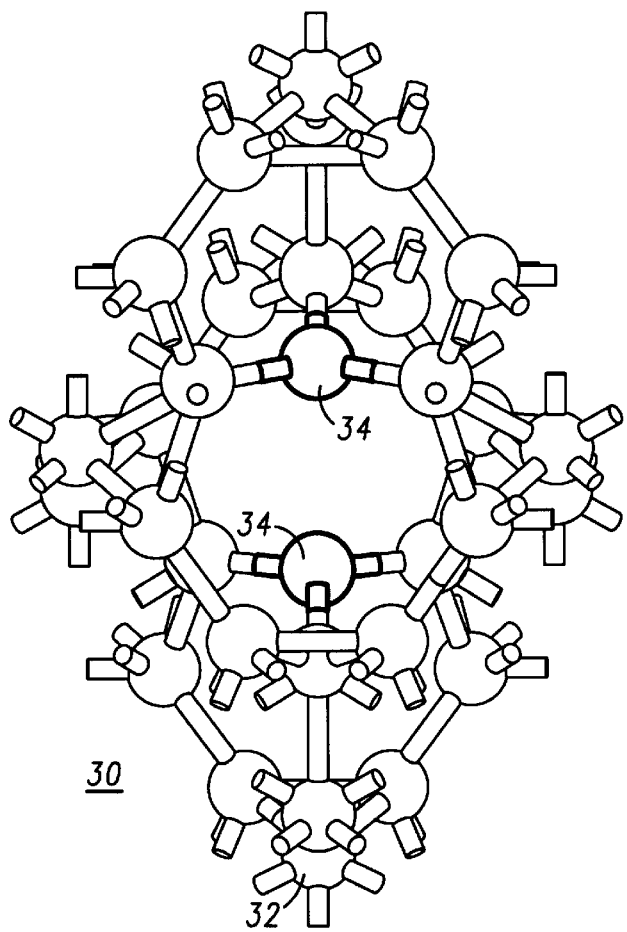
FIG. 3 is a three-dimensional view of yet another prior art single unit cell which comprises a thermoelectric material.

Referring now to FIG. 3, illustrated is another prior art boron carbide unit cell 30, comprised of a plurality of boron atoms 32 and a plurality of carbon atoms 34. Unit cell 30, as illustrated in FIG. 3, shows another potential defect in the boron carbide material which consists of a missing boron in the CBC chain. The formation energy of this defect is relatively high, being approximately 1.5 eV per defect. It requires a very high temperature to create significant numbers of this particular defect, specifically requiring temperatures above 2500 K°, for a very long time, sometimes several days, to generate sufficient numbers of defects within the plurality of unit cells that comprise the thermoelectric material. This defect appears to be a deep-level acceptor. Its energy levels are approximately 0.7 and 1.3 eV above the valence band-edge.

As previously stated, good thermoelectric performance of boron carbide is related to the defects present in the material. Each of the previously mentioned defects, or defect chains, as illustrated in the individual unit cells 10, 20 and 30, serves as a localized state for electron and hopping conduction through these states. The prior art unit cells 10, 20 and 30, as illustrated in FIGS. 1, 2, and 3, respectively, use heat to generate the defective carbon chain in the boron carbide which requires a long time to anneal at elevated temperatures or quenching from a melt. The novel approach disclosed herein, eliminates this high temperature annealing, and thereby provides for a simplified process, including easy process control, and more consistent material parameters.

Figure 4:
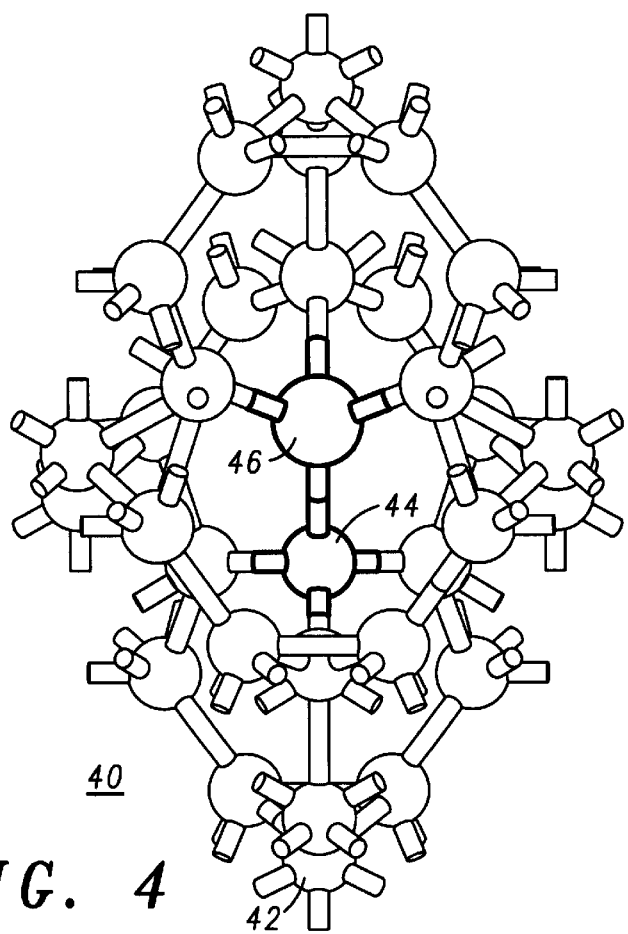
FIG. 4 is a three-dimensional view of a single unit cell which comprises a thermoelectric material illustrating doping of the material with silicon according to the present invention.

Referring now to FIG. 4, illustrated in simplified three-dimensional view is a unit cell, referenced 40, according to the present invention. Unit cell 40 is comprised of a plurality of boron atoms 42 and a carbon atom 44. Unit cell 40 is doped with a single silicon atom 46. It should be understood that unit cell 40 represents a single unit cell of the many unit cells that comprise the thermoelectric material. In this particular embodiment, the unit cell is formed from a Group IV element boride, such as carbon boride, also known as boron carbide, or silicon boride, also known as boron silicide, which is doped with a doping element chosen from the group consisting of Group III, IV or V elements, wherein the doping element is different from the Group IV element in the Group IV element boride and the doping element is not boron. It should be understood that when the unit cell is formed to include plain boron, the material is doped with at least one element chosen from one of the Group III, IV, or V elements, other than boron. Similarly, when then Group IV element boride is formed as boron carbide, the material is doped with at least one element other than boron, being chosen from one of the Group III or V elements, or silicon (Si), germanium (Ge), tin (Sn), or lead (Pb). In addition, when the Group IV element boride is formed as silicon boride, the material is doped with at least one element other than boron, being chosen from one of the Group III or V elements, or carbon (C), germanium (Ge), tin (Sn), or lead (Pb).

In a preferred embodiment doping concentration is preferred to a level of approximately 0.5 to 15 at. %. Accordingly, a combination of unit cells similar to unit cell 40, illustrated in FIG. 4, as well as a plurality of additional cells differing in atomic structure, comprise the thermoelectric material at a doping level of approximately 0.5 to 15 at. %. In this particular embodiment, unit cell 40 includes silicon atom 46 which reduces the defect formation energy of the missing boron defect of unit cell 30 illustrated in FIG. 3, to zero. The density is essentially determined by the number of silicon atoms in the material. Silicon is a p-type dopant to boron carbide with an energy level of 0.5 eV above the valence band-edge. Silicon is much heavier than boron and carbon and can disrupt phonon propagation when randomly distributed in boron carbide, thus reducing thermal conductivity and improving thermoelectric performance.

Figure 5:
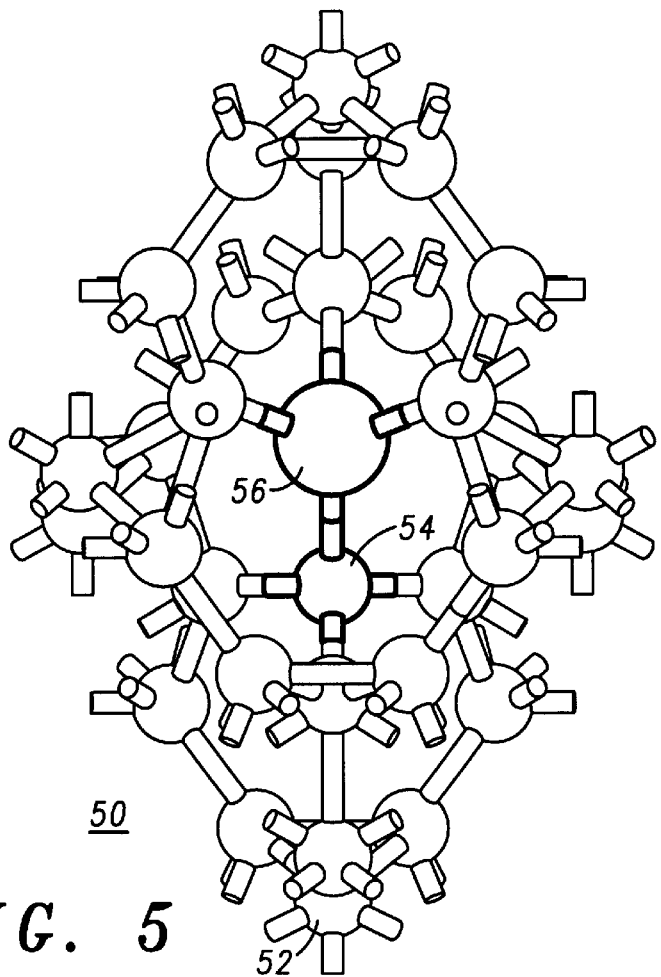
FIG. 5 is a three-dimensional view of a single unit cell which comprises a thermoelectric material illustrating doping of the material with germanium according to the present invention.

Referring now to FIG. 5, illustrated in simplified three-dimensional view is a unit cell, referenced 50, according to the present invention. Unit cell 50, generally similar to unit cell 40 of FIG. 4, is comprised of a plurality of boron atoms 52 and a carbon atom 54. Unit cell 50 is doped with a single germanium atom 56. It should be understood that unit cell 50 represents a single unit cell of the plurality of unit cells that comprise the thermoelectric material. As previously stated, the thermoelectric material is doped with an element chosen from the Group III, or V elements, including silicon (Si), germanium (Ge), lead (Pb), or tin (Sn), wherein the doping element is different from the Group IV element in the Group IV element boride, and the doping element is not boron. The doping concentration of the Group IV element is preferred to a level of approximately 0.5 to 15 at. %. In this particular embodiment, unit cell 50 includes germanium atom 56 which is heavier than silicon and modifies the electronic structure of boron carbide 50 in the same manner in which silicon does. Accordingly, germanium in boron carbide will effectively reduce the thermal conductivity of the material, thereby improving its use as a thermoelectric material.

Figure 6:
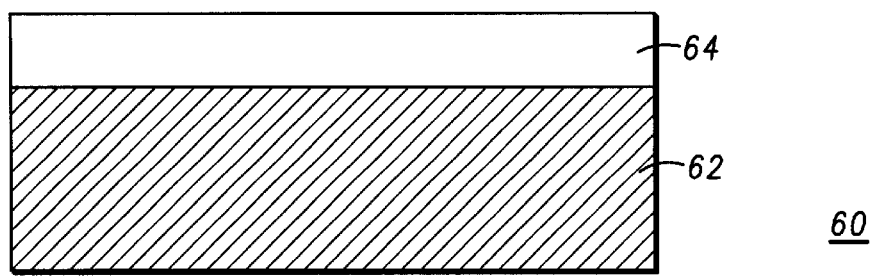
FIG. 6 is a simplified sectional view of a thermoelectric material according to the present invention.

The doping of the Group IV element boride takes place by doping the material with a doping element chosen from the Group III, IV or V elements, wherein the doping element is not boron, subsequent to the growth process, or by simultaneously depositing or growing the material including boron and a doping material chosen from the Group III, IV or V elements, wherein the doping element is not boron, onto a substrate material utilizing commonly known deposition techniques, such as chemical vapor deposition (CVD), or the like, wherein the doping element is different from the Group IV element in the Group IV element boride, and the Group III dopant is not boron. Referring now to FIG. 6, illustrated is a thermoelectric material 60 comprised of a substrate material 62, onto which a boron carbide material and a doping element chosen from the Group IV elements 64 are simultaneously grown. Substrate material 62 in this particular embodiment is a type silicon, but it should be understood that alternative materials for substrate 62 are anticipated by this disclosure such as glass, plastic, or any other suitable material. In an alternative method of fabricating thermoelectric material 60, a layer of boron carbide is deposited and then doped with a doping element chosen from the column IV elements. Fabrication in this manner includes doping utilizing, implant, diffusion, or the like, to achieve a doping concentration level of approximately 0.5 to 15 at. %.

During the process of fabricating thermoelectric material 60, the following chemical reactions take place. Initially fully carbonated boron carbide has the formula of B4C and it consists almost entirely of B11C icosahedrons connected by CBC chains. As the composition becomes more boron rich, CBB chains start to largely replace the CBC chains. The formula of a fully reacted boron rich boron carbide when all the CBC chains are replaced by the CBB chains is B13C2. Further carbon reduction will lead to the replacement of the B11C icosahedrons by B12 icosahedrons. The formula of a fully reacted boron rich boron carbide when all of the B11C icosahedrons are replaced by the B12 icosahedrons is B14C. However, it is disclosed herein that the carbon atoms at the end of the chains are energetically very stable and difficult to be removed. It is therefore more likely to form a defective chain in the form of C*C, where * represents a boron vacancy. Each of the defective chains serves as a localized state for electron hopping conduction through these states. Hopping then becomes the nature of the electron conductivity in boron carbide. Silicon atom 46, as illustrated in FIG. 4, is found to be more attractive in replacing the carbon atom in a defective chain to form a Si*C chain, where * represents a boron vacancy. Accordingly, the mixing of a semiconductor material chosen from the column IV elements, such as silicon, germanium, lead, or tin, improves the thermoelectric performance of boron carbide.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A thermoelectric material comprising a Group IV element boride that is one of implant doped or diffusion doped with at least one doping element chosen from the group consisting of Group III and Group IV elements, wherein the doping element is different from the Group IV element in the Group IV element boride and the doping element is not boron.

2. A thermoelectric material as claimed in claim 1 wherein the Group IV element boride is carbon boride.

3. A thermoelectric material as claimed in claim 2 wherein the boron carbide is doped with one of a Group III element, silicon (Si), germanium (Ge), tin (Sn), or lead (Pb).

4. A thermoelectric material as claimed in claim 1 wherein the Group IV element boride is silicon boride.

5. A thermoelectric material as claimed in claim 4 wherein the silicon boride is doped with one of a Group III element, carbon (C), germanium (Ge), tin (Sn), or lead (Pb).

6. A thermoelectric material as claimed in claim 1 wherein the Group IV element boride is doped to a concentration of between 0.5 to 15 at.%.

7. A thermoelectric material as claimed in claim 1 wherein the doping element is provided during growth of the Group IV element boride.

8. A thermoelectric material as claimed in claim 1 wherein the Group IV element boride is produced from a melt.

9. A method of fabricating a thermoelectric material including the steps of:

providing a Group IV element boride material;

doping the Group IV element boride material with at least one doping element chosen from the group consisting of Group III and Group IV elements, wherein the step of doping the Group IV element boride material includes doping the material by one of implant doping techniques or thermal diffusion doping techniques with an element different than the Group IV element in the Group IV element boride material and the doping element is not boron.

10. A method of fabricating a thermoelectric material as claimed in claim 9 wherein the step of providing a Group IV element boride material includes providing carbon boride.

11. A method of fabricating a thermoelectric material as claimed in claim 10 wherein the carbon boride is doped with one of a Group III element, silicon (Si), germanium (Ge), tin (Sn), or lead (Pb).

12. A method of fabricating a thermoelectric material as claimed in claim 9 wherein the step of providing a Group I element boride material includes providing silicon boride.

13. A method of fabricating a thermoelectric material as claimed in claim 12 wherein the silicon boride is doped with one of a Group III element, silicon (Si), germanium (Ge), tin (Sn), or lead (Pb).

14. A method of fabricating a thermoelectric material as claimed in claim 9 wherein the step of doping the Group IV element boride with at least one element chosen from the group consisting of Group III and Group IV elements, includes doping the Group IV element boride to a doping concentration of between 0.5 to 15 at.%.

15. A method of fabricating a thermoelectric material including the steps of:

simultaneously growing a Group IV element boride and at least one doping element chosen from the group consisting of Group III and Group IV elements;

wherein the at least one element chosen from the group consisting of Group III and Group IV elements is different than the Group IV element in the Group IV element boride material and the doping element is not boron.

16. A method of fabricating a thermoelectric material as claimed in claim 15 wherein the step of simultaneously growing a Group IV element boride and at least one doping element chosen from the group consisting of Group III and Group IV elements includes simultaneously growing carbon boride with at least one doping element chosen from the group consisting of Group III and Group IV elements.

17. A method of fabricating a thermoelectric material as claimed in claim 15 wherein the step of simultaneously growing a Group IV element boride and at least one doping element chosen from the group consisting of Group III and Group IV elements includes simultaneously growing silicon boride with at least one doping element chosen from the group consisting of Group III and Group IV elements.

* * * * *